(12) United States Patent
Shindo et al.

(10) Patent No.: US 11,367,997 B2
(45) Date of Patent: Jun. 21, 2022

(54) SEMICONDUCTOR INTEGRATED OPTICS ELEMENT AND PRODUCTION METHOD THEREFOR

(71) Applicant: Nippon Telegraph and Telephone Corporation, Tokyo (JP)

(72) Inventors: Takahiko Shindo, Musashino (JP); Naoki Fujiwara, Musashino (JP); Kimikazu Sano, Musashino (JP); Hiroyuki Ishii, Musashino (JP); Hideaki Matsuzaki, Musashino (JP); Takashi Yamada, Musashino (JP); Kengo Horikoshi, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 124 days.

(21) Appl. No.: 16/978,339

(22) PCT Filed: Feb. 28, 2019

(86) PCT No.: PCT/JP2019/007910
§ 371 (c)(1),
(2) Date: Sep. 4, 2020

(87) PCT Pub. No.: WO2019/172089
PCT Pub. Date: Sep. 12, 2019

(65) Prior Publication Data
US 2021/0006032 A1 Jan. 7, 2021

(30) Foreign Application Priority Data
Mar. 7, 2018 (JP) .............................. JP2018-040912

(51) Int. Cl.
*H01S 5/026* (2006.01)
*H01S 5/02* (2006.01)
(Continued)

(52) U.S. Cl.
CPC .......... *H01S 5/0265* (2013.01); *H01S 5/0202* (2013.01); *H01S 5/227* (2013.01); *H01S 5/405* (2013.01); *H01S 5/50* (2013.01)

(58) Field of Classification Search
CPC ............................ H01S 5/2224; H01S 5/0202
(Continued)

(56) References Cited

U.S. PATENT DOCUMENTS

| 10,074,959 B2* | 9/2018 | Blauvelt | ............... H01S 5/1203 |
| 2008/0013881 A1* | 1/2008 | Welch | .................... G02B 6/136 |
| | | | 385/14 |
| 2008/0025358 A1* | 1/2008 | Arahira | ............... H01S 5/06256 |
| | | | 372/38.02 |

FOREIGN PATENT DOCUMENTS

| JP | 2005-197511 A | 7/2005 |
| JP | 2012-19248 A | 1/2012 |

(Continued)

OTHER PUBLICATIONS

Wataru Kobayashi et al., *Novel Approach for Chirp and Output Power Compensation Applied to a 40-Gbit/s EADFB Laser Integrated with a Short SOA*, Opt. Express, vol. 23, No. 7, Apr. 2015, pp. 9533-9542.

*Primary Examiner* — Tuan N Nguyen
(74) *Attorney, Agent, or Firm* — Workman Nydegger

(57) ABSTRACT

A method for manufacturing a monolithically integrated semiconductor optical integrated element comprising a DFB laser, an EA modulator, and a SOA disposed in a light emitting direction, comprising the step of forming a semiconductor wafer on which the elements are two-dimensionally arrayed and aligned the optical axes; cleaving the semiconductor wafer along a plane orthogonal to the light emitting direction to form a semiconductor bar including a plurality of the elements arranged one-dimensionally along a direction orthogonal to the light emitting direction such
(Continued)

that the elements adjacent to each other share an identical cleavage end face as a light emission surface; inspecting the semiconductor bar by driving the SOA and the DFB laser through a connection wiring part together; and separating out the semiconductor bar after the inspection to cut the connection wiring part connecting the electrode of the SOA and the DFB laser to isolate from each other.

5 Claims, 7 Drawing Sheets

(51) Int. Cl.
*H01S 5/227* (2006.01)
*H01S 5/40* (2006.01)
*H01S 5/50* (2006.01)

(58) Field of Classification Search
USPC ......................................................... 372/50.1
See application file for complete search history.

(56) References Cited

FOREIGN PATENT DOCUMENTS

| JP | 2013-258336 A | 12/2013 |
|----|---------------|---------|
| JP | 2017-118052 A | 6/2017 |
| JP | 2017-228654 A | 12/2017 |

\* cited by examiner

SEMICONDUCTOR INTEGRATED OPTICS ELEMENT AND PRODUCTION METHOD THEREFOR

TECHNICAL FIELD

The present invention relates to a semiconductor optical integrated element such as a modulation laser that includes an electroabsorption (EA) optical modulator and a semiconductor laser integrated on a substrate of a semiconductor like indium phosphide (InP), and to a method for manufacturing the same. Specifically, the present invention relates to a high-power semiconductor optical integrated element made up of an EA modulator and a semiconductor optical amplifier (SOA), and a distributed feedback (DFB) laser, and to a method for manufacturing the same.

BACKGROUND ART

In recent years, network traffic has enormously increased along with the widespread use of video distribution services and growing demand for mobile traffic. This has generated lively discussions about next-generation networks, particularly a field of networks called access networks. A trend in the field of the next-generation access networks is demand for extended transmission distance and multi-branch transmission. There is also a growing need for increases in intensity of light output from semiconductor modulation light sources used in these networks to meet an increase in branching ratio.

As compared to direct modulation type lasers that directly drive laser by modulation electric signals, electroabsorption modulator-integrated DFB (EADFB) lasers have high extinction and excellent chirp characteristics and thus have been used for a wide range of applications including light sources for access networks.

FIG. 1 is a schematic cross-sectional view of a substrate of a conventional general EADFB laser that is aligned along a light emitting direction. The general EADFB laser has a waveguide structure in which a DFB laser 11 and an EA modulator (EAM) 12 are monolithically integrated in an identical chip along the light emitting direction. The DFB laser 11 includes an active layer 11a made up of a multiple quantum well (MQW) and lets laser light of a single wavelength oscillate by a diffraction grating 11b formed in a resonator. The EA modulator 12 includes a light-absorption layer 12a made up of a multiple quantum well (MQW) that differs in composition from the MQW in the DFB laser, and modulates laser light by changing an amount of light absorption by voltage control. Under conditions that allow laser light output from the DFB laser 11 to be transmitted and absorbed, the EADFB laser electrically drives the EA modulator 12 by modulation signals to let the light blink and converts electric signals into optical signals (light modulation) to emit the converted signals.

This EADFB laser performs light modulation by using the light absorption function of the EA modulator and thus poses a problem that a satisfactorily high extinction characteristic and a growth in the intensity of output light have a trade-off relationship in theory.

FIG. 2 shows an extinction curve of a general EADFB laser to illustrate principles of light intensity modulation. One method for achieving a growth in the intensity of light output from the general EADFB laser involves making an absolute value of a reverse bias voltage applied to the EA modulator smaller and thereby reducing light absorption performed by the EA modulator. In this case, however, the EA modulator operates at a portion of the extinction curve that shows lowered steepness, resulting in a deterioration in modulation characteristic, i.e., dynamic extinction ratio (DER).

Another method involves increasing current for driving the DFB laser and thereby increasing the intensity of laser light incident from the DFB laser on the EA modulator. Unfortunately, this method causes not only an increase in power consumed by the DFB laser but also an increase both in light absorption performed by the EA modulator and resultant photocurrent. This deteriorates the extinction characteristic and results in an excessive increase in power consumed by the entire chip. As described above, the conventional EADFB laser has difficulty in achieving both satisfactory light output and modulation characteristic (dynamic extinction ratio) and inevitably causes an excessive increase in power consumption.

To address this problem, Non-Patent Literature 1 conventionally proposes an EADFB laser that further includes a semiconductor optical amplifier (SOA) integrated in a light emitting end of the EADFB laser (an SOA assisted extended reach EADFB Laser: AXEL).

FIG. 3 is a schematic cross-sectional view of a substrate of another conventional EADFB laser (AXEL) integrated with an SOA. In the AXEL, laser signal light that is generated by a DFB laser 31 and modulated by an EA modulator 32 is independently amplified in a monolithically integrated SOA region 33 before being output. This allows the AXEL to increase light output without a deterioration in optical signal waveform quality. As compared to the previous conventional EADFB laser, the AXEL is able to output intensified light without an excessive increase both in drive current for the DFB laser 31 and photocurrent produced by the EA modulator 32.

In the AXEL, an active layer 33a of the SOA 33 has an MQW structure identical to that of an active layer 31a of the DFB laser 31. This eliminates the need for an additional regrowth process for the integration of the SOA region and hence a device of the AXEL can be made through a manufacturing process identical to that for the previous conventional EADFB laser.

Another characteristic of the AXEL, as shown in FIG. 3, is that the SOA 33 and the DFB laser 31 in an identical element can be electrically connected to each other so as to be driven through an identical terminal. Since the SOA 33 and the DFB laser 31 are driven through an identical terminal, part of a drive current for the DFB laser 31 is supplied to the SOA 33. Distribution of this current is determined depending on a ratio (volumetric) of a length of the DFB laser 31 to a length of the SOA 33. Hence, regions of the SOA 33 and the DFB laser 31 operate on an identical current density. As a result, the AXEL can be operated by a driving method identical to that for the previous conventional EADFB laser without an increase in a number of terminals compared to the previous conventional EADFB laser (see Patent Literature 1).

FIG. 4 is a bird's-eye view of a chip of a conventional AXEL, showing disposition of electrodes in regions of the conventional AXEL. In FIG. 4, a substrate of the chip is partly cut off to facilitate understanding of cross-sectional structures of the regions. The conventional AXEL shown in FIG. 4 has an electrode pattern in which electrodes (41c, 43c) in an SOA region 43 and a DFB laser region 41 are connected together on an element in a stage of manufacture of the chip. This configuration enables driving of the SOA and the DFB laser through a common terminal in an inspection process after the manufacture of the chip. This eliminates the need for an additional inspection process associated with the integration of the SOA region, and the regions of the AXEL can be assessed in terms of normality through an inspection process identical to that for the previous conventional EADFB laser.

As described above, in addition to the output of intensified light and a reduction in power consumption owing to the integration of the SOA region, a big advantage of the AXEL over the previous conventional EADFB laser is that the AXEL can be manufactured through production and inspection processes identical to those for the EADFB laser.

CITATION LIST

Patent Literature

Patent Literature 1: Japanese Patent Laid-Open No. 2013-258336

Non-Patent Literature

Non-Patent Literature 1: W Kobayashi et al., "Novel approach for chirp and output power compensation applied to a 40-Gbit/s EADFB laser integrated with a short SOA," Opt. Express, Vol. 23, No. 7, pp. 9533-9542, April 2015

SUMMARY OF THE INVENTION

Technical Problem

In recent years, however, along with an increase in branching ratio for splitters, there has been a growing need for increases in the intensity of light output from modulation light sources used in networks, particularly access networks. As described above, the AXEL is excellent in low power consumption and high output characteristic as compared to general EADFB lasers. Nevertheless, a further growth in the intensity of output light is essential to achieve a level of light output required for the AXEL in the future.

Another method for increasing the light output of an AXEL involves increasing an optical gain acquired in the SOA region. As described above, the conventional AXEL is operated by driving the SOA and the DFB laser through a common terminal. Thus, if the drive current is adjusted to a level that ensures a stable operation of the DFB laser, an amount of the current applied to the SOA is determined depending on a volumetric ratio between the DFB laser and the SOA.

Hence, it is necessary to independently drive the SOA and the DFB laser on separate current sources and supply a satisfactory drive current to the SOA to enable the AXEL to output further intensified light. In addition, it is desirable to design an SOA that has a long length with a view to achieving a growth in the intensity of light output from the AXEL. This is because, as described above, an increase in length of the resonator of the DFB laser and a resultant growth in the intensity of light output from the DFB laser cause increases both in photocurrent produced by the EA modulator and power consumption.

Accordingly, a growth in the intensity of output light necessitates designing an SOA that has a long length to enable independent amplification of light without being subject to light absorption performed by the EA modulator. However, a problem posed for a laser adopting a long SOA length is a deterioration of waveform quality due to a pattern effect associated with a carrier variation inside the SOA.

A carrier density inside the SOA needs to be satisfactorily increased to reduce the pattern effect inside the SOA. In this case as well, it is necessary to independently drive the DFB laser and the SOA and set a current density for the SOA at a level higher than that for the DFB laser.

Because of the points described above, it is essential to enable driving of the SOA and the DFB laser independently in order to achieve a further growth in the intensity of light output from the AXEL. In this case, an inspection process needs to be added to separately check the SOA region for normality at the time of manufacture of the AXEL. This disadvantageously leads to an increase in manufacturing costs.

In view of the problem described above, it is an object of the present invention to provide a semiconductor optical integrated element (an AXEL) that eliminates the need for an inspection process added to separately check an SOA region for normality at a time of manufacture of the AXEL and that prevents an increase in manufacturing costs, with the aim of achieving a further growth in the intensity of light output from the semiconductor optical integrated element (the AXEL). It is another object of the present invention to provide a method for manufacturing such a semiconductor optical integrated element.

Means for Solving the Problem

To achieve these objects, the present invention has the following constitutions.
First Constitution of Invention
A semiconductor optical integrated element having a distributed feedback (DFB) laser, an electroabsorption (EA) modulator, and a semiconductor optical amplifier (SOA) that are monolithically integrated on an identical substrate and that are disposed in an order of the DFB laser, the EA modulator, and the SOA along a light emitting direction,
wherein a plurality of the semiconductor optical integrated elements is arranged one-dimensionally along a direction orthogonal to the light emitting direction to constitute a semiconductor bar such that optical axes of the semiconductor optical integrated elements are aligned and that the semiconductor optical integrated elements adjacent to each other share an identical cleavage end face as a light emission surface,
wherein each of the semiconductor optical integrated elements in the semiconductor bar has a connection wiring part to electrically connect an electrode of the SOA and an electrode of the DFB laser together, and
wherein the connection wiring part is formed such that the connection wiring part straddles a boundary line between the adjacent semiconductor optical integrated elements in the semiconductor bar.
Second Constitution of Invention
The semiconductor optical integrated element according to the first constitution of the invention, wherein the DFB laser, the EA modulator, and the SOA are formed all together to have a mesa stripe structure, and
wherein both side walls of the mesa stripe structure is formed so as to have a buried heterostructure in which both side walls of the mesa stripe structure are buried by p-type and n-type semiconductor layers grown collectively.
Third Constitution of Invention
The semiconductor optical integrated element according to either the first constitution or the second constitution of the invention, wherein the semiconductor optical integrated element is formed such that a length of the SOA is greater than or equal to 150 µm.

Fourth Constitution of Invention

A method for manufacturing a semiconductor optical integrated element, including the steps of:

forming a semiconductor wafer by arranging a plurality of semiconductor optical integrated elements two-dimensionally such that optical axes of the semiconductor optical integrated elements are aligned, the semiconductor optical integrated elements each having a distributed feedback (DFB) laser, an electroabsorption (EA) modulator, and a semiconductor optical amplifier (SOA) that are monolithically integrated on an identical substrate and that are disposed in an order of the DFB laser, the EA modulator, and the SOA along a light emitting direction;

cleaving the semiconductor wafer along a plane orthogonal to the light emitting direction to form a semiconductor bar including a plurality of the semiconductor optical integrated elements arranged one-dimensionally along a direction orthogonal to the light emitting direction such that the semiconductor optical integrated elements adjacent to each other share an identical cleavage end face as a light emission surface;

inspecting each of the semiconductor optical integrated elements in a state of the semiconductor bar; and cutting off each of the semiconductor optical integrated elements of the semiconductor bar at a boundary line between the adjacent semiconductor optical integrated elements after the inspection to electrically isolate the SOA and the DFB laser from each other, wherein in the step of forming the semiconductor wafer, a connection wiring part electrically connecting the SOA and the DFB laser together is formed on each of the semiconductor optical integrated elements such that the connection wiring part straddles the boundary line between the adjacent semiconductor optical integrated elements.

Fifth Constitution of Invention

The method for manufacturing the semiconductor optical integrated element, according to the fourth constitution of the invention, wherein the step of inspection includes inspecting the SOA and the DFB laser by simultaneously energizing and driving the SOA and the DFB laser through the connection wiring part.

DETAILED DESCRIPTION OF THE INVENTION

Effects of the Invention

As described above, a semiconductor optical integrated element and a method for manufacturing the same according to the present invention enables an AXEL or another semiconductor optical integrated element designed to output further intensified light to dispense with an additional inspection process and prevent an increase in manufacturing costs.

DESCRIPTION OF EMBODIMENTS

Summary of the Present Invention

Figure 1:
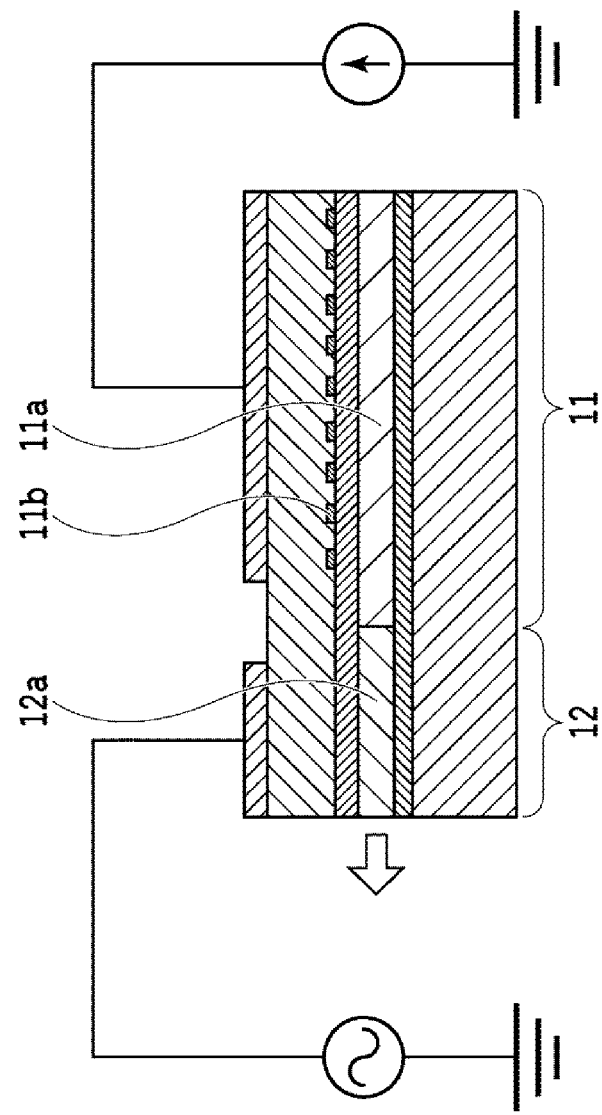
FIG. 1 is a schematic cross-sectional view of a substrate of a conventional general EADFB laser.
Figure 2:
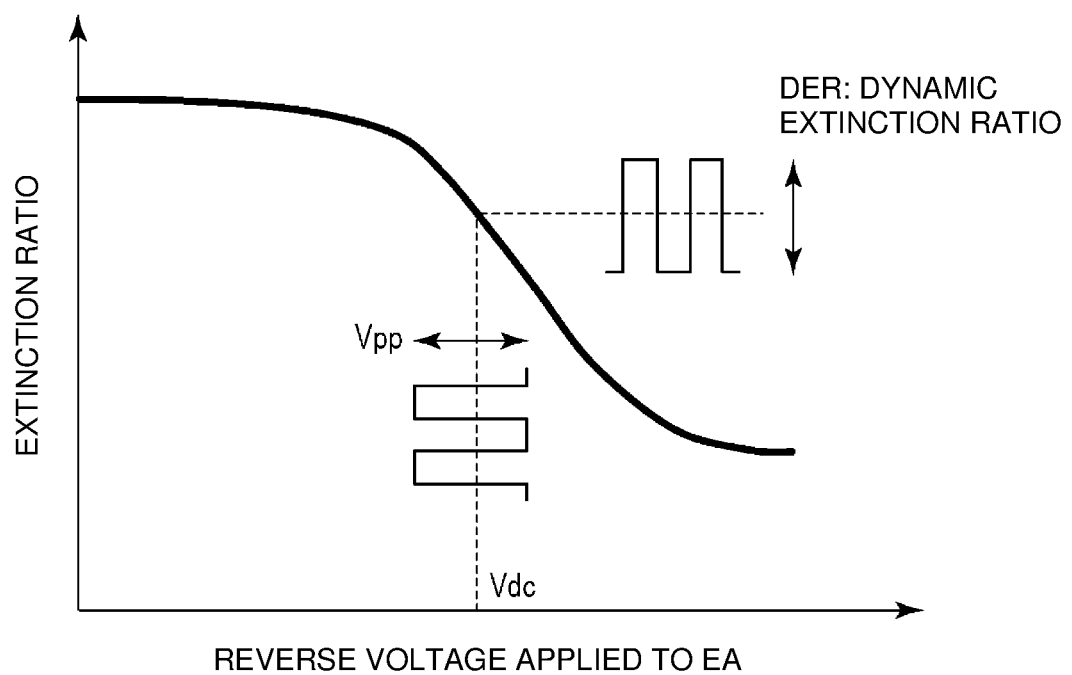
FIG. 2 is a graph showing an extinction curve of a conventional general EADFB laser to illustrate principles of light intensity modulation.
Figure 3:
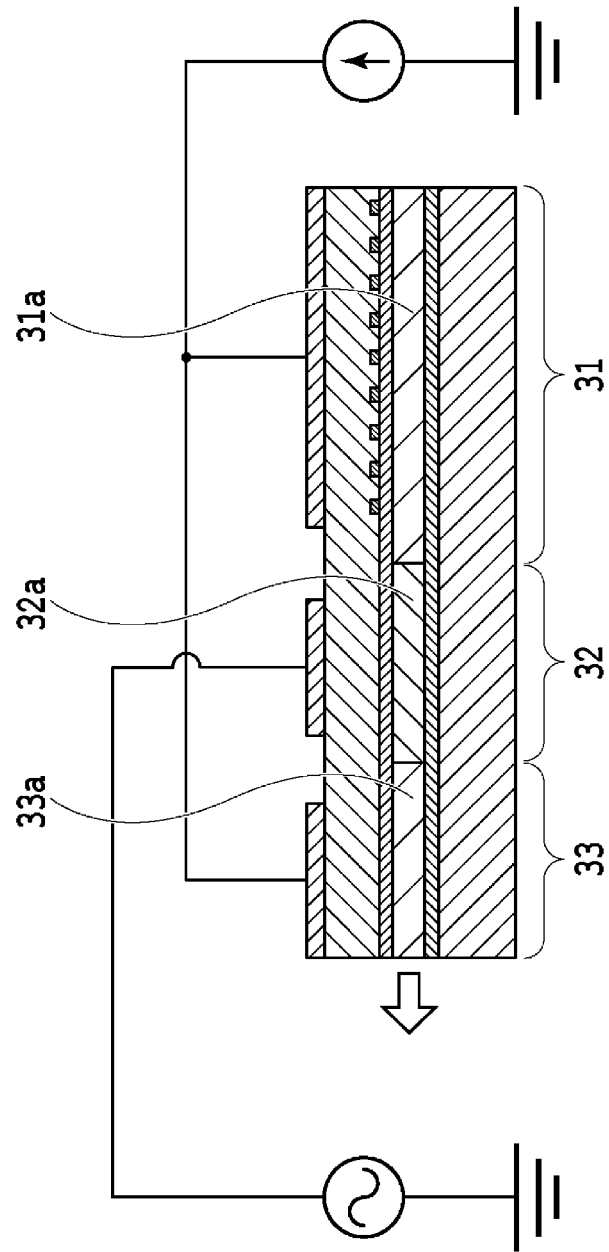
FIG. 3 is a schematic cross-sectional view of a substrate of a conventional EADFB laser (an AXEL) integrated with an SOA.

The present invention, accomplished to solve the problem described above, provides a connection wiring part as an electrode pattern used to electrically connect an SOA and a DFB laser in a chip (an element) of an AXEL at a time of manufacture of the chip. The connection wiring part is disposed so as to spread over regions of the adjacent chips. Concurrently, the connection wiring part is disposed so as to be cut during a process for separating the adjacent chips from each other after an inspection. While a plurality of the chips is arranged one-dimensionally inside a semiconductor bar in a direction orthogonal to an optical wave guide direction, the regions of each of the chips are checked for normality in an inspection process at the time of manufacture. Thus, the SOA and the DFB laser in each of the chips (the elements) are electrically connected to each other. This configuration enables simultaneous inspection and checking of the two components.

When the adjacent elements are separated into individual chips after the inspection process, the connection wiring part is cut and thus the SOA and the DFB laser in each of the chip elements are electrically isolated from each other and can be independently driven.

According to the present invention, the AXEL configured to independently drive the SOA and the DFB laser of the AXEL prevents an increase in costs incurred in the processes of manufacture and inspection of the chip and provides an ultrahigh-output modulation light source through a manufacturing process and manufacturing costs identical to those for the conventional EADFB laser. In other words, the SOA unit and the EADFB laser unit in each of the elements are electrically connected to each other inside the semiconductor bar during the inspection process and thus the SOA and the DFB laser can be simultaneously inspected for normality by applying power to one electrode on one element in a similar way to the conventional EADFB laser. Further, the semiconductor bar is separated into the individual elements after the inspection process and the SOA and the DFB laser in each of the elements are thereby electrically isolated from each other. This allows the SOA and the DFB laser to individually operate on arbitrary current values when the AXEL is actually driven.

The advantages of the present invention described above are not directly related to lengths of the SOA and the DFB laser of the AXEL and a ratio between the lengths of the two components. However, if the SOA is designed to have a long SOA length to achieve a growth in the intensity of light output from the AXEL, a satisfactory drive current needs to be supplied to the SOA to reduce a pattern effect. Accordingly, if an SOA that is long relative to the DFB laser is adopted for the AXEL, it is essential to independently drive the SOA and the DFB laser. If the SOA and the DFB laser in an AXEL that uses a general DFB laser length of 300 μm are driven through a common terminal in a similar way to the conventional technique, a case of an SOA length of 150 μm or longer has a marked pattern effect. Thus, the present invention produces a strong effect especially on AXELs with an SOA length of 150 μm or longer.

Embodiments of the present invention will now be described in detail with reference to the attached drawings.

First Embodiment

Figure 5:
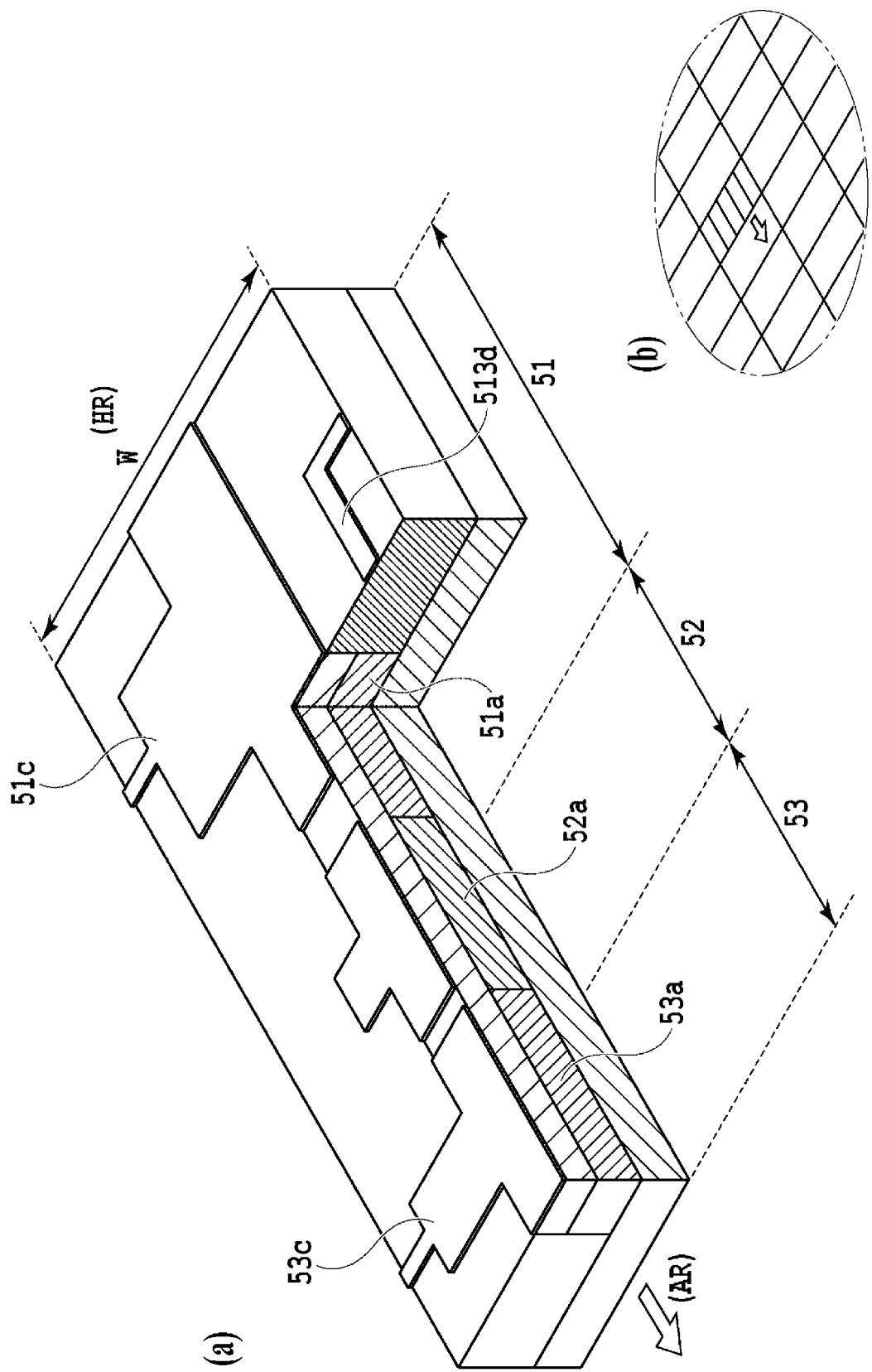
FIG. 5(a) is a bird's-eye view of a chip of an AXEL according to a first embodiment of the present invention.
FIG. 5(b) is a drawing showing a plurality of chips formed and arranged two-dimensionally on a semiconductor wafer in a middle of a manufacturing process.

In FIG. 5, a bird's-eye view of a chip of an AXEL according to a first embodiment of the present invention is shown. FIG. 5(a) is a bird's-eye view of a single chip that is finally separated out after a test. FIG. 5(b) shows a plurality of chips formed and arranged two-dimensionally on a semiconductor wafer in a middle of a manufacturing process, illustrating one chip in a semiconductor bar described later with a symbol of outgoing laser light.

In the first embodiment, a chip is made with an objective of achieving a modulated light output power characteristic of 9.0 dBm or greater, which is generally required for a high-output light source applied to future access networks. The chip has an oscillation wavelength of 1.57 μm.

In a similar way to normal semiconductor elements, production of an AXEL chip element of FIG. 5(a) according to the first embodiment is such that a large number of the elements arranged two-dimensionally on a substrate of a semiconductor wafer, as shown in FIG. 5(b), are fabricated simultaneously. In FIG. 5(b), the AXEL chip elements are arranged in units of semiconductor bars that each include a plurality of the elements arranged one-dimensionally, and a plurality of the semiconductor bars is arranged two-dimensionally with optical axes of the elements being aligned.

Figure 4:
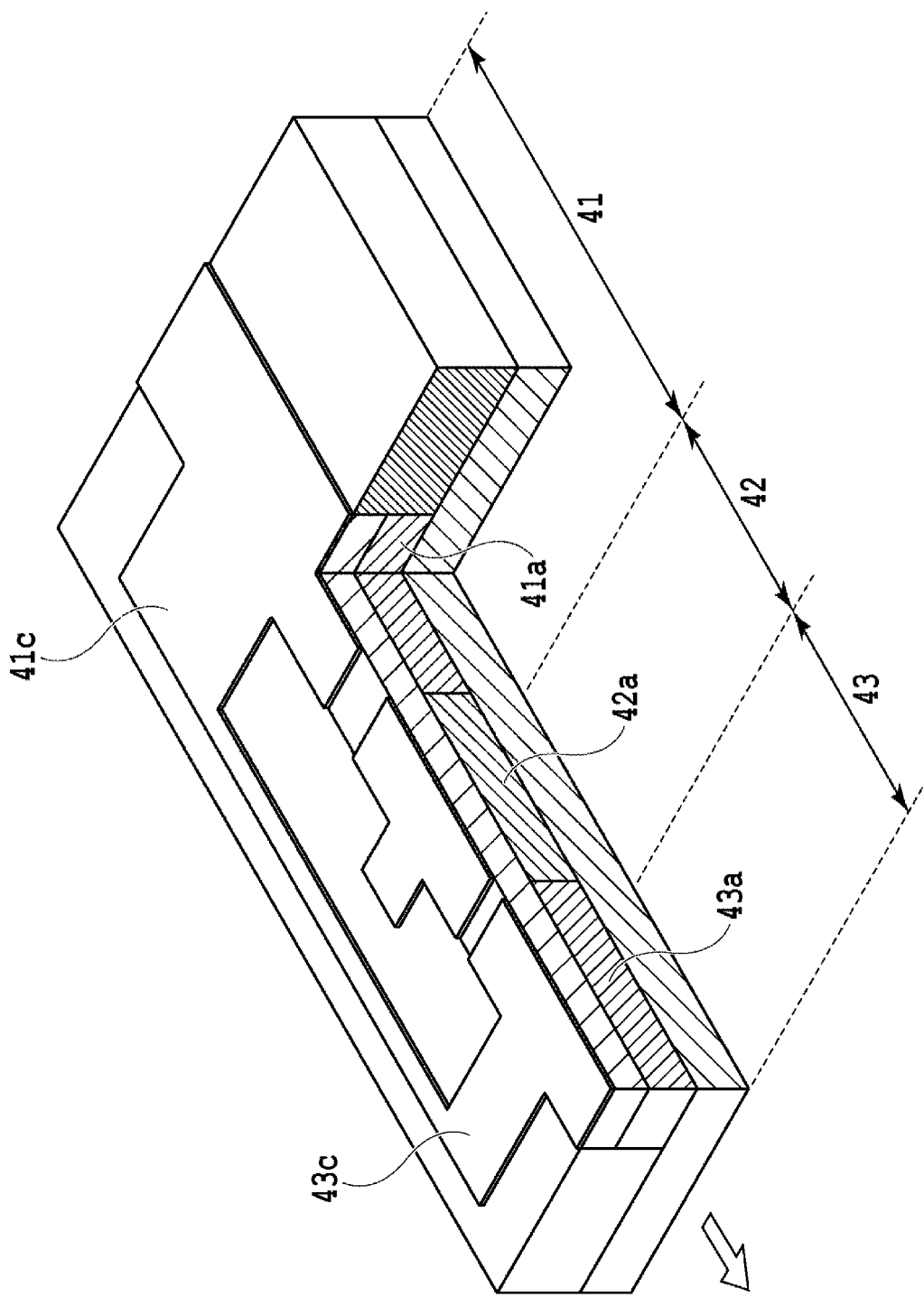
FIG. 4 is a bird's-eye view of a chip of a conventional AXEL, showing disposition of electrodes in regions of the conventional AXEL.

In a similar way to a conventional AXEL chip of FIG. 4, the AXEL chip element of FIG. 5(a) includes a DFB laser element 51, an EA modulator 52, and an SOA 53 that are fabricated on an identical substrate and monolithically integrated in this order along a light emitting direction. In the first embodiment, the AXEL chip element is designed such that a length of a resonator of the DFB laser 51 is 300 μm, a length of the EA modulator 52 is 120 μm, and a length of the SOA 53 is 150 μm.

An initial substrate wafer used for the production of the AXEL element of FIG. 5(a) according to the first embodiment includes a lower separated confinement heterostructure (SCH) layer, a multiple quantum well active layer (MQW 1), and an upper SCH layer grown in sequence on an n-type indium phosphide (n-InP) substrate. The active layer (MQW 1) constitutes an active layer 51a of the DFB laser 51 and an active layer 53a of the SOA 53.

First, a diffraction grating that is adjusted so as to operate at a oscillation wavelength of 1.57 μm is formed over a region of the active layer 51a of the DFB laser 51. Next, a portion where the EA modulator 52 is to be formed is selectively etched and a multiple quantum well structure (MQW 2) for an absorption layer 52a of the EA modulator is grown by butt-joint regrowth.

After that, a p-type InP (p-InP) cladding layer is formed in an upper part by regrowth. A thickness of the cladding layer is designed so as not to allow an optical field to invade an electrode zone and is 2.0 μm in the first embodiment.

Next, a mesa structure of an optical waveguide is formed by etching and semi-insulating InP layers doped with Fe are again formed on both sides of a mesa through burying regrowth. Next, an electrode pattern including electrodes 51c, 53c for the DFB laser and the SOA and a connection wiring part 513d for the two components is formed on an upper surface of the semiconductor substrate. After that, a backside of the InP substrate is ground to an extent of around 150 μm, and an electrode is formed on the backside of the substrate to complete the steps performed over the semiconductor wafer.

In the first embodiment, a structure of the waveguide is a layered structure including a core layer (a thickness of 200 nm in total) made up of the multiple quantum well active layer and the upper and lower SCH layers and InP upper and lower cladding layers that put the core layer therebetween in a cross-sectional thickness direction of the substrate orthogonal to the waveguide. In a cross-sectional horizontal direction of the substrate, the waveguide has a buried heterostructure in which the InP layers are formed on both sides of the mesa. The optical waveguide has a stripe width of 1.5 μm and operates in a DFB mode attributed to the diffraction grating formed in the laser resonator. In the SOA part, a structure of the core layer formed in the initial growth substrate remains as-is and differs from a layered structure of the DFB laser 51 only in that the SOA part has no diffraction grating.

As shown in FIG. 5(b), after the completion of a structure of the plurality of the elements arranged two-dimensionally on the wafer with the optical axes of the elements being aligned, the wafer with the waveguide structure according to the first embodiment is cleaved and split along a plane orthogonal to the light emitting direction so as to form a structure of the semiconductor bars that each include a plurality of the elements arranged one-dimensionally along a direction orthogonal to the light emitting direction. In each of the semiconductor bars, the plurality of the elements is arranged at equal intervals such that the adjacent elements share an identical cleavage end face as a light emission surface or a reflection surface. A distance between the adjacent elements is set to a chip width W that is equal to 400 μm.

A full length of the semiconductor bar is, for example, around 10 mm in consideration of convenience to the following steps and the semiconductor bar includes 25 pieces of the elements, for example. A size of the semiconductor bar is approximately 0.57 mm×10 mm and the 25 elements are arranged one-dimensionally along a direction orthogonal to the light emitting direction. However, the effect of the present invention should not be limited to the length of the semiconductor bar, the number of the elements inside the semiconductor bar, and the interval between the elements.

In a state of the semiconductor bar, an anti-reflection (AR) coating is applied to light-emission cleavage surfaces of the AXEL elements adjacent to the SOAs 53, whereas a high reflectance (HR) coating is applied to reflection cleavage surfaces of the AXEL elements adjacent to the DFB lasers 51.

After that, by lowering an electrode probe to each of the elements in the semiconductor bar, power is simultaneously applied to the DFB laser unit and the SOA unit through the connection wiring part and output light is measured to inspect the DFB laser unit and the SOA unit for normality.

Figure 6:
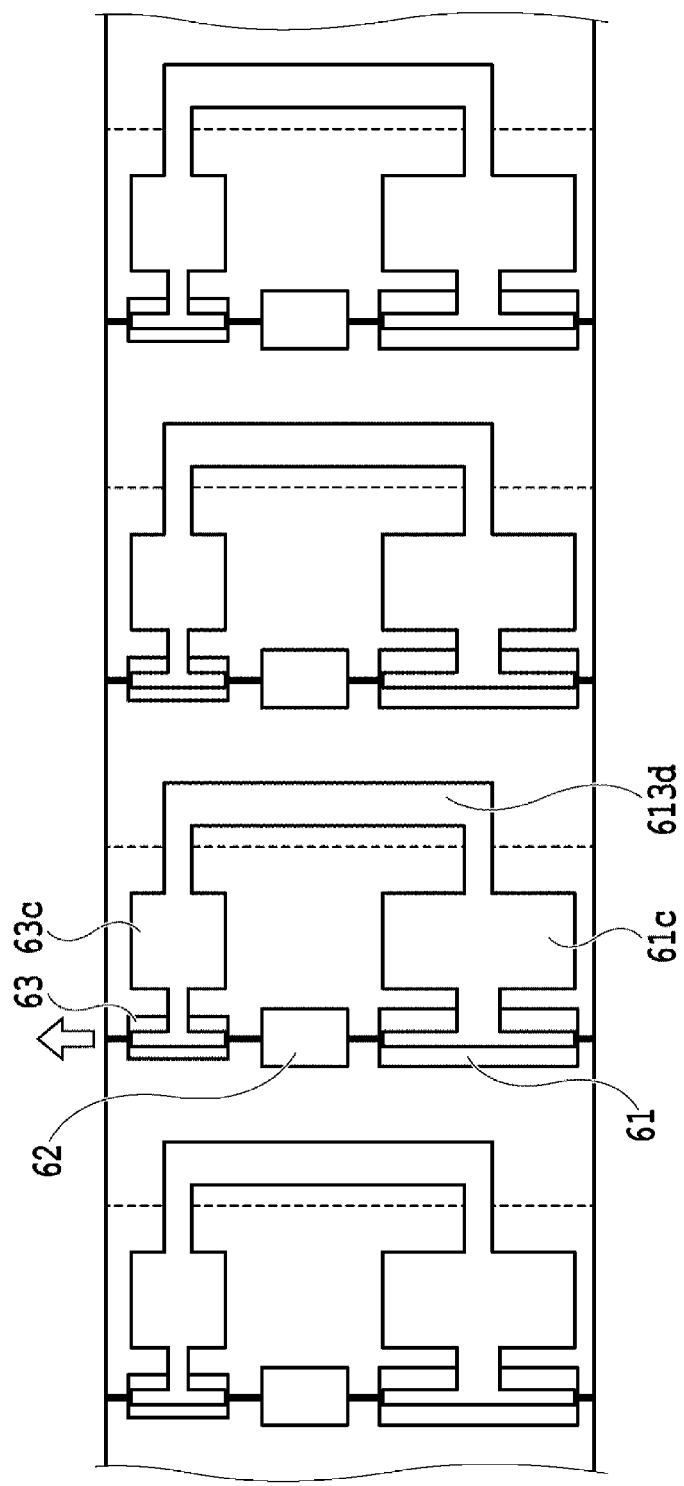
FIG. 6 is a plan view showing a part of a semiconductor bar that includes chips of the AXEL according to the first embodiment of the present invention in an inspection process.

FIG. 6 is a plan view of a part of a semiconductor bar in an inspection process involved in a manufacturing method according to the first embodiment, schematically showing the part of the semiconductor bar to facilitate the understanding of an electrode pattern. Although 25 chips are contained in the semiconductor bar as described above, this example illustrates only four elements adjacent to each other that include an Nth element (N<25). Places of cleavage that are each a boundary line between the adjacent elements when each of the elements inside the semiconductor bar is finally separated out after an inspection are indicated with four longitudinal dotted lines in FIG. 6. As shown in FIG. 6, an SOA electrode pad 63c and a DFB laser electrode pad 61c for the Nth element are formed inside a region of the Nth element.

A connection wiring part 613d having a U-shape and electrically connecting the SOA electrode 63c and the DFB laser electrode 61c together is formed such that two cross bars of the U-shape straddle a boundary line between the Nth element and an adjacent N+1th element. In a state of the semiconductor bar in which the elements are inspected, the SOA electrode 63c and the DFB laser electrode 61c in each of the elements are electrically connected together owing to a structure of the connection wiring part 613d.

The connection wiring part 613d can be formed all together in a step for forming the DFB electrode 61c and the SOA electrode 63c in the process of manufacturing the wafer for the AXEL. Addition of the connection wiring part 613d does not increase a load of the manufacturing process.

In an inspection process for the AXEL chip using this structure, because of the electrical connection between the DFB laser unit 61 and the SOA unit 63, the DFB laser unit and the SOA unit can be simultaneously energized and driven and be simultaneously inspected. After the regions of each of the elements are inspected for normality, the elements in the semiconductor bar are separated from one another by cleavage or other means at each of the boundary lines between the adjacent elements indicated with the longitudinal dotted lines in FIG. 6. The connection wiring part 613d is thereby cut.

As shown in FIG. 6, when the semiconductor bar is cleaved at the boundary lines for the elements, which are designated as separation places in a stage of design, each of the connection wiring parts 613d is cut. As a result, the SOA 63 and the DFB laser 61 in each of the elements are electrically isolated from each other and can be driven by individual power sources. In each of the separated elements, a portion of the connection wiring part 613d that extends off a region of the adjacent element under a state of the semiconductor bar still remains. The remaining portion, however, does not affect operation and characteristics of each of the elements.

A planar shape of the connection wiring part 613d may be any shape such as a polygonal line or a curved line other than the U-shape shown in FIG. 6, with proviso that the shape allows the connection wiring part to be cut by separation of the adjacent elements.

An optical transmitter including an AXEL element manufactured by the method of the first embodiment was evaluated to see transmission characteristics at 10 Gb/s. The element for which normality of regions was confirmed in an inspection process was mounted on a module of the optical transmitter. A reverse voltage applied to an EAM and a modulation amplitude for the EAM were Vdc=−0.7 V and Vpp=2 V respectively, which are general modulation conditions for EADFB lasers.

A current injected into a semiconductor laser was set to 120 mA and a current injected into an SOA was set to 80 mA, and the evaluation test confirmed that light output during modulation was 10.0 dBm. This means that the SOA operated on a current density higher than that for the DFB laser. Under the modulation conditions, a test for transmission over 40 km was conducted using a $2^{31}-1$ bit pseudorandom binary sequence (PRBS) generator for non-return-to-zero (NRZ) signals.

First, the test confirmed a satisfactory eye opening based on an evaluation of a back-to-back eye waveform. In addition, a test for transmission over a 40 km single mode fiber (SMF) confirmed an error-free operation that reaches a bit error rate of $10^{-12}$.

Second Embodiment

Figure 7:
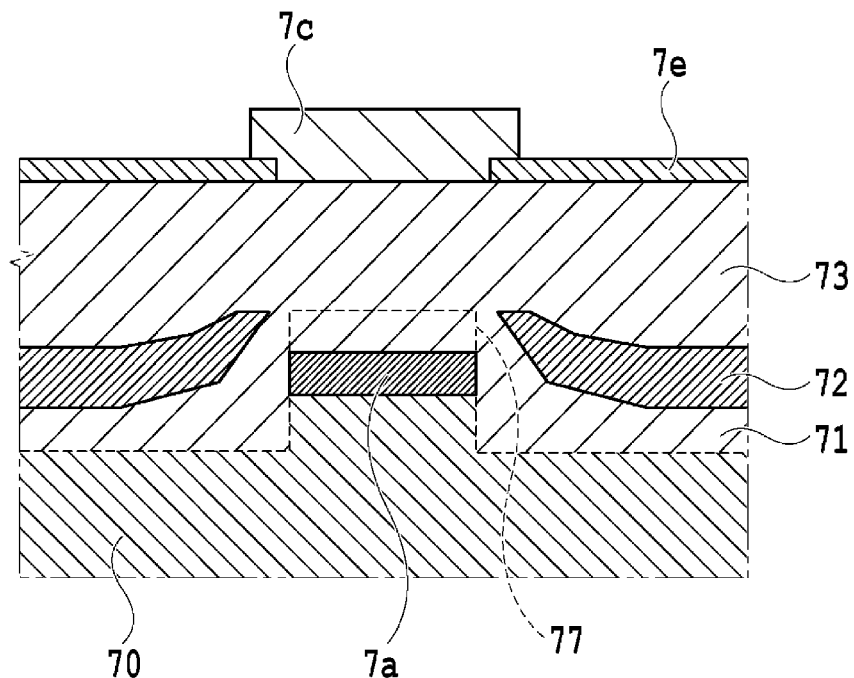
FIG. 7 is a cross-sectional view of a waveguide in a chip of an AXEL according to a second embodiment of the present invention.

FIG. 7 is a drawing showing a cross section of a waveguide in a chip of an AXEL according to a second embodiment of the present invention. In FIG. 7, an active layer 7a having a mesa structure 77 is disposed on an n-InP substrate 70. A p-InP layer 71, an n-InP layer 72, a p-InP cladding layer 73 are formed around the mesa structure 77 such that a waveguide is embedded. An upper surface of the cladding layer is covered with an electrode 7c and an insulating film 7e.

In the second embodiment, a chip is designed to serve as a light source for access networks, with an objective of achieving a modulated light output power of 12 dBm or greater. A cross-sectional structure of the waveguide is a buried heterostructure that has a structure of a thyristor made up of p-type and n-type semiconductors with high current constriction effect.

In a general buried heterostructure, a current block layer consists of a semi-insulating semiconductor layer that provides decreased capacity to reduce a parasitic capacity of a region of an EA modulator and cover a wider frequency band. In contrast, a current block layer having the thyristor structure made up of p-type and n-type semiconductors according to the second embodiment is able to provide increased output because of high current constriction effect and efficient light emission by currents injected into a semiconductor laser. However, when p-type and n-type conductive semiconductors are used for the current block layer, a semiconductor junction capacitance is generated in a lower part of the electrode pad of the EA modulator. This causes an increase in frequency band rate-limiting during modulation as compared to a current block layer made up of a semi-insulating semiconductor as in the first embodiment.

Nevertheless, an application specifically intended for high output characteristics as in the second embodiment is allowed to ensure a satisfactory frequency band due to a relatively low modulation speed. An oscillation wavelength band of an AXEL element manufactured in the second embodiment is a 1.49 μm band. In the second embodiment, the AXEL element includes a DFB laser, an EA modulator, and an SOA that are fabricated on an identical substrate. A length of a resonator of the DFB laser is 300 μm, a length of the EA modulator is 120 μm, and a length of the SOA is 300 μm.

An initial substrate wafer used for the production of the element according to the second embodiment includes a lower separated confinement heterostructure (SCH) layer, a multiple quantum well active layer (MQW 1), an upper SCH layer, and a p-InP layer grown in sequence on an n-InP substrate.

First, a diffraction grating that is adjusted so as to operate at a band of an oscillation wavelength of 1.49 µm is formed over a region of the DFB laser. Next, a portion where the EA modulator is to be formed is selectively etched and a multiple quantum well structure (MQW 2) that constitutes an absorption layer of the EA modulator is grown by butt-joint regrowth.

After that, the mesa structure 77 indicated with a dotted line in FIG. 7 is formed. The p- and n-InP layers 71 and 72 are grown in sequence to bury both sides of a mesa and form respective current block layers.

Then, after removal of an insulating film from an upper part of the mesa, a p-InP cladding layer 73 is formed by regrowth. A thickness of the cladding layer is 2.0 µm. Next, an insulating film 7e is deposited on an entire surface of the wafer. After removal of an insulating film from an upper part of a stripe in each region into which a current is injected, an electrode pattern 7c for the regions of the SOA, the EA modulator, and the DFB laser is formed on a surface of the substrate in a similar way to the first embodiment. At the same time, an electrode pattern for a connection wiring part is formed. After that, a backside of the InP substrate is ground to an extent of around 150 µm, and an electrode is formed on the backside of the substrate to complete the steps performed over the semiconductor wafer.

In the AXEL chip according to the second embodiment, the optical waveguide has a mesa stripe width of 1.5 µm and operates in a DFB mode attributed to the diffraction grating formed in the laser resonator. In the SOA part, a core layer structure formed in the initial growth substrate remains as-is and differs from a layered structure of the DFB laser only in that the SOA part has no diffraction grating.

In the second embodiment, the SOA, the EA modulator, and the DFB laser have a common buried heterostructure made up of p-type and n-type InP current block layers formed through burying regrowth (see FIG. 7).

In a similar way to the first embodiment, after the completion of a structure of a plurality of the elements arranged two-dimensionally on the wafer with the optical axes of the elements being aligned, the wafer is cleaved and split along a plane orthogonal to the light emitting direction so as to form a structure of semiconductor bars that each include a plurality of the elements arranged one-dimensionally along a direction orthogonal to the light emitting direction. In each of the semiconductor bars, the elements are arranged at equal intervals such that the adjacent elements share an identical cleavage end face as a light emission surface or a reflection surface. A distance between the adjacent elements is set to a chip width W that is equal to 200 µm.

A full length of the semiconductor bar is, for example, around 10 mm in consideration of convenience to the following steps and the semiconductor bar includes 50 pieces of the elements, for example. A size of the semiconductor bar is 0.72 mm×10 mm and the 50 elements are arranged one-dimensionally along a direction orthogonal to the light emitting direction. However, the effect of the present invention should not be limited to the length of the semiconductor bar and the number of the elements inside the semiconductor bar.

In a state of the semiconductor bar, an anti-reflection (AR) coating is applied to light-emission cleavage surfaces of the AXEL elements adjacent to the SOAs, whereas a high reflectance (HR) coating is applied to reflection cleavage surfaces of the AXEL elements adjacent to the DFB lasers.

After that, by lowering an electrode probe to each of the elements in the semiconductor bar, power is applied to the DFB laser unit and the SOA unit through the connection wiring part and output light is measured to inspect the DFB laser unit and the SOA unit for normality.

Figure 8:
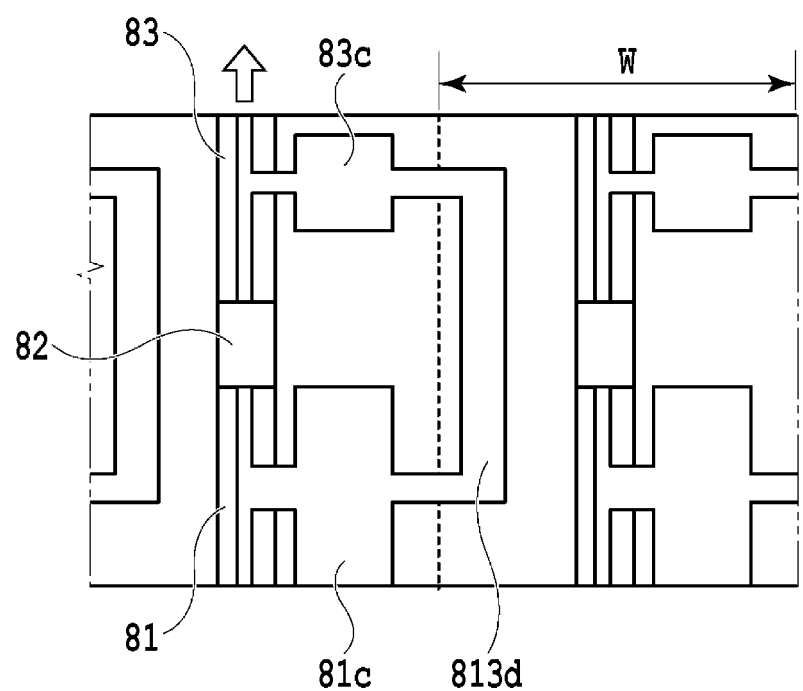
FIG. 8 is a plan view showing a part of a semiconductor bar that includes chips of the AXEL according to the second embodiment of the present invention in an inspection process.

FIG. 8 is a plan view of a part of a semiconductor bar in an inspection process involved in a manufacturing method according to the second embodiment, schematically showing only two adjacent chip regions to facilitate the understanding of an electrode pattern. A place of cleavage that is a boundary line when each of the elements is finally separated out is indicated with a longitudinal dotted line in a middle of the figure. As shown in FIG. 8, an SOA electrode pad 83c and a DFB laser electrode pad 81c are formed inside a region of an element.

A connection wiring part 813d having a U-shape and electrically connecting the SOA electrode 83c and the DFB laser electrode 81c together is formed such that two cross bars of the U-shape straddle a boundary line between the adjacent elements. In a state of the semiconductor bar before the elements are separated from each other, a DFB laser unit 81 and an SOA unit 83 in the identical element are electrically connected together owing to a structure of the connection wiring part. Thus, in an inspection process, the DFB laser unit and the SOA unit can be simultaneously energized and driven and be simultaneously inspected. After an inspection, the elements in the semiconductor bar are separated from each other by cleavage at the boundary line between the adjacent elements indicated with the longitudinal dotted line in the middle of FIG. 8. The connection wiring part 813d is thereby cut.

As shown in FIG. 8, when the semiconductor bar is cleaved or split at the boundary lines for the elements, which are designated as separation places in a stage of design, the connection wiring part 813d is cut. As a result, the SOA 83 and the DFB laser 81 in each of the elements are electrically isolated from each other and can be driven by individual power sources. In each of the separated elements, a portion of the connection wiring part 813d that extends off a region of the adjacent element under a state of the semiconductor bar still remains. The remaining portion, however, does not affect operation and characteristics of each of the elements. The connection wiring part 813d may have any shape in a similar way to the first embodiment.

An optical transmitter including an AXEL element manufactured by the method of the second embodiment was evaluated to see transmission characteristics at 1.0 Gb/s. The element for which normality of regions was confirmed in an inspection process was mounted on a module of the optical transmitter. A reverse voltage applied to an EAM and a modulation amplitude for the EAM were Vdc=−1.0 V and Vpp=2 V respectively, which are general modulation conditions for EADFB lasers.

A current injected into a semiconductor laser was set to 100 mA and a current injected into an SOA was set to 120 mA, and the evaluation test confirmed that light output during modulation after fiber connection was 12.0 dBm and the AXEL element exhibited a satisfactorily high output characteristic relative to the target light output power. This means that the SOA operated on a current density higher than that for the DFB laser. Under the operating conditions, a test for transmission over 20 km was conducted using a $2^{31}-1$ bit PRBS generator for NRZ signals.

First, the test confirmed a satisfactory eye opening based on an evaluation of a back-to-back eye waveform. In addition, a test for transmission over a 40 km SMF confirmed an error-free operation that reaches a bit error rate of $10^{-12}$.

INDUSTRIAL APPLICABILITY

As described above, a semiconductor optical integrated element and a method for manufacturing the same according to the present invention enables an AXEL designed to output further intensified light to dispense with an additional inspection process and prevent an increase in manufacturing costs.

REFERENCE SIGNS LIST

11, 31, 41, 51, 61, 81 DFB laser
11*a*, 31*a*, 41*a*, 51*a*, 7*a* active layer
11*b* diffraction grating
12, 32, 42, 52, 62, 82 EA modulator (EAM)
12*a*, 32*a*, 42*a*, 52*a* light-absorption layer
33, 43, 53, 63, 83 SOA
33*a*, 43*a*, 53*a* active layer
41*c*, 43*c*, 51*c*, 53*c*, 51*c*, 53*c*, 7*c*, 81*c*, 83*c* electrode
513*d*, 613*d*, 813*d* connection wiring part
70 n-InP substrate
77 mesa structure
71 p-InP layer
72 n-InP layer
73 p-InP cladding layer
7*e* insulating film

The invention claimed is:

1. A semiconductor optical integrated element comprising a distributed feedback (DFB) laser, an electroabsorption (EA) modulator, and a semiconductor optical amplifier (SOA) that are monolithically integrated on an identical substrate and that are disposed in an order of the DFB laser, the EA modulator, and the SOA along a light emitting direction,
wherein a plurality of the semiconductor optical integrated elements is arranged one-dimensionally along a direction orthogonal to the light emitting direction to constitute a semiconductor bar such that optical axes of the semiconductor optical integrated elements are aligned and that the semiconductor optical integrated elements adjacent to each other share an identical cleavage end face as a light emission surface,
wherein each of the semiconductor optical integrated elements in the semiconductor bar has a connection wiring part to electrically connect an electrode of the SOA and an electrode of the DFB laser together, and
wherein the connection wiring part is formed such that the connection wiring part straddles a boundary line between the adjacent semiconductor optical integrated elements in the semiconductor bar.

2. The semiconductor optical integrated element according to claim 1, wherein the DFB laser, the EA modulator, and the SOA are formed all together to have a mesa stripe structure, and wherein both side walls of the mesa stripe structure is formed so as to have a buried heterostructure in which both side walls of the mesa stripe structure are buried by p-type and n-type semiconductor layers grown collectively.

3. The semiconductor optical integrated element according to claim 1, wherein the semiconductor optical integrated element is formed such that a length of the SOA is greater than or equal to 150 μm.

4. A method for manufacturing a semiconductor optical integrated element, comprising the steps of:
forming a semiconductor wafer by arranging a plurality of semiconductor optical integrated elements two-dimensionally such that optical axes of the semiconductor optical integrated elements are aligned, the semiconductor optical integrated elements each comprising a distributed feedback (DFB) laser, an electroabsorption (EA) modulator, and a semiconductor optical amplifier (SOA) that are monolithically integrated on an identical substrate and that are disposed in an order of the DFB laser, the EA modulator, and the SOA along a light emitting direction;
cleaving the semiconductor wafer along a plane orthogonal to the light emitting direction to form a semiconductor bar including a plurality of the semiconductor optical integrated elements arranged one-dimensionally along a direction orthogonal to the light emitting direction such that the semiconductor optical integrated elements adjacent to each other share an identical cleavage end face as a light emission surface;
inspecting each of the semiconductor optical integrated elements in a state of the semiconductor bar; and
cutting off each of the semiconductor optical integrated elements of the semiconductor bar at a boundary line between the adjacent semiconductor optical integrated elements after the inspection to electrically isolate the SOA and the DFB laser from each other,
wherein in the step of forming the semiconductor wafer, a connection wiring part electrically connecting the SOA and the DFB laser together is formed on each of the semiconductor optical integrated elements such that the connection wiring part straddles the boundary line between the adjacent semiconductor optical integrated elements.

5. The method for manufacturing the semiconductor optical integrated element, according to claim 4, wherein the step of inspection includes inspecting the SOA and the DFB laser by simultaneously energizing and driving the SOA and the DFB laser through the connection wiring part.

* * * * *